(12) United States Patent
Sakata

(10) Patent No.: US 9,404,964 B2
(45) Date of Patent: Aug. 2, 2016

(54) SEMICONDUCTOR INTEGRATED CIRCUIT

(71) Applicant: SOCIONEXT INC., Yokohama-shi, Kanagawa (JP)

(72) Inventor: Tsuyoshi Sakata, Frankfurt am Main (DE)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/590,711

(22) Filed: Jan. 6, 2015

(65) Prior Publication Data
US 2015/0236678 A1 Aug. 20, 2015

(30) Foreign Application Priority Data
Feb. 14, 2014 (JP) ................. 2014-026629

(51) Int. Cl.
*H03L 7/00* (2006.01)
*G01R 31/28* (2006.01)
*H03K 3/03* (2006.01)

(52) U.S. Cl.
CPC .......... *G01R 31/2884* (2013.01); *H03K 3/0315* (2013.01)

(58) Field of Classification Search
None
See application file for complete search history.

(56) References Cited

U.S. PATENT DOCUMENTS

| 6,856,558 B1* | 2/2005 | Proebsting | H03H 11/265 365/190 |
| 2001/0019291 A1 | 9/2001 | Nakano | |
| 2007/0176661 A1* | 8/2007 | Shin | H03K 3/0315 318/268 |
| 2011/0090015 A1 | 4/2011 | Sumita et al. | |
| 2013/0147501 A1* | 6/2013 | Yamagishi | G01R 31/2884 324/750.3 |

FOREIGN PATENT DOCUMENTS

| JP | 2001-242223 A | 9/2001 |
| JP | 2010-087275 A | 4/2010 |
| JP | 2011-166222 A | 8/2011 |

* cited by examiner

*Primary Examiner* — Cassandra Cox
(74) *Attorney, Agent, or Firm* — Arent Fox LLP

(57) ABSTRACT

There are provided: a first buffer circuit which includes buffers being circuits to be measured connected in series, whose output and input are connected to a first input terminal and a second output terminal of a control circuit, respectively; a second buffer circuit which includes buffers being circuits to be measured connected in series whose number is the same as a number of the buffers included in the first buffer circuit, whose output and input are connected to a second input terminal and a first output terminal of the control circuit, respectively; and the control circuit which makes the entire circuit is a negative logic when a first operation is set, and simultaneously outputs signals with different logics from the output terminals at a time of a start of an oscillation operation and makes the entire circuit is a positive logic when a second operation is set.

7 Claims, 6 Drawing Sheets

SEMICONDUCTOR INTEGRATED CIRCUIT

CROSS-REFERENCE TO RELATED APPLICATION

This application is based upon and claims the benefit of priority of the prior Japanese Patent Application No. 2014-026629, filed on Feb. 14, 2014, the entire contents of which are incorporated herein by reference.

FIELD

The embodiments discussed herein are directed to a semiconductor integrated circuit.

BACKGROUND

In a semiconductor integrated circuit, not only an operating speed and a circuit area but also a power consumption is one of important factors, and the semiconductor integrated circuit has been demanded to achieve a low power consumption. In order to improve the power consumption of the semiconductor integrated circuit, there is a technique of performing a control in accordance with a process variation and a use state of the semiconductor integrated circuit. For example, there are techniques such as an ASV (Adaptive Supply Voltage) for controlling a power supply voltage supplied to a semiconductor integrated circuit, an ABB (Adaptive Body Bias) for controlling a back bias, and a DVFS (Dynamic Voltage Frequency Scaling) for dynamically controlling an operating frequency and a power supply voltage.

It is possible to appropriately conduct the control in accordance with the process variation and the use state of the semiconductor integrated circuit, by using a sense circuit and the like to read a state of the semiconductor integrated circuit. When the low power consumption technique as described above is employed, delay characteristic information of the semiconductor integrated circuit is important, and it is possible to determine an operation margin of the semiconductor integrated circuit and a tolerance value capable of controlling a speed of the semiconductor integrated circuit, from the delay characteristic information. As a method of obtaining the delay characteristic information of the semiconductor integrated circuit, a method of using a ring oscillator (refer to Patent Document 1, for example) and a method of using a buffer ring (refer to Patent Document 2, for example) have been known.

In the method of using the ring oscillator, the ring oscillator is configured by using a circuit to be measured, and a number of times of oscillation during a certain period is measured. From a frequency calculated based on the measured number of times of oscillation, a sum of a delay time when a low-level signal is input and a delay time when a high-level signal is input, is obtained as delay characteristic information of the circuit to be measured. The delay time when the low-level signal is input corresponds to a delay time when an input signal is changed from a high level to a low level. The delay time when the high-level signal is input corresponds to a delay time when an input signal is changed from a low level to a high level. However, in the method of using the ring oscillator, it is not possible to accurately divide the delay time when the low-level signal is input and the delay time when the high-level signal is input.

In the method of using the buffer ring, a plurality of buffers 200 being circuits to be measured are connected in series in a ring shape to configure the buffer ring, as illustrated in FIG. 8A. For example, a state where a node NDA in the buffer ring is fixed to a low level, and a state where a node NDB separated by a half round from the node NDA is fixed to a high level are created, and then the states are simultaneously released to start an oscillation. When a delay time when a low-level signal is input is shorter than a delay time when a high-level signal is input in the buffer 200 being the circuit to be measured, for example, if a signal is observed at one node in the buffer ring, a delay time DLL in the vicinity of the low level is shorter than a delay time DLH in the vicinity of the high level, as illustrated in FIG. 8B. As a result of this, a waveform is deformed and a high-level period becomes gradually short (refer to 210 in FIG. 8B), and after the oscillation is performed a certain number of times, the oscillation is stopped.

As described above, in the method of using the buffer ring, by measuring the number of times of oscillation up to when the oscillation is stopped due to the difference of the delay times, and by obtaining a signal level when the oscillation is stopped, it is possible to obtain a ratio of the delay time when the low-level signal is input and the delay time when the high-level signal is input, as delay characteristic information of the circuit to be measured. For example, when the oscillation is performed N times and the signal is eventually fixed to a high level, the high-level signal travels (N+½) rounds when the low-level signal travels N rounds in the buffer ring, resulting in that it can be understood that the speed of signal in the vicinity of the high level is faster than that in the vicinity of the low level, and a speed ratio of the low-level signal and the high-level signal is N:(N+½).

Patent Document 1: Japanese Laid-open Patent Publication No. 2010-87275
Patent Document 2: Japanese Laid-open Patent Publication No. 2011-166222

In the method of using the ring oscillator described above, it is possible to obtain, as the delay characteristic information of the circuit to be measured, the sum of the delay time when the low-level signal is input and the delay time when the high-level signal is input. In the method of using the buffer ring, it is possible to obtain, as the delay characteristic information of the circuit to be measured, the ratio of the delay time when the low-level signal is input and the delay time when the high-level signal is input. However, it is not possible to obtain a value of each of the delay time when the low-level signal is input and the delay time when the high-level signal is input, as delay characteristic information of the circuit to be measured.

SUMMARY

One aspect of a semiconductor integrated circuit includes: a first buffer circuit which includes a plurality of buffers being circuits to be measured connected in series; a second buffer circuit which includes a plurality of buffers being circuits to be measured connected in series, a number of the plurality of buffers included in the second buffer circuit being the same as a number of the plurality of buffers included in the first buffer circuit; and a control circuit which includes a second output terminal connected to an input of the first buffer circuit, a first input terminal connected to an output of the first buffer circuit, a first output terminal connected to an input of the second buffer circuit, and a second input terminal connected to an output of the second buffer circuit. When a first operation is set, the control circuit outputs a signal whose logic is the same as that of a signal input into the first input terminal, from the first output terminal, and outputs a signal whose logic is different from that of a signal input into the second input terminal, from the second output terminal. When a second operation is set, the control circuit simultaneously outputs signals with different logics from the first output terminal and the second output terminal at a time of a start of an oscillation operation, outputs a signal whose logic is the same as that of the signal input into the first input terminal, from the first output terminal, and outputs a signal whose logic is the same as that of the signal input into the second input terminal, from the second output terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments will be described based on the drawings.

As described above, in the method of using the ring oscillator, it is possible to obtain, as the delay characteristic information of the circuit to be measured, the sum of the delay time when the low-level signal is input and the delay time when the high-level signal is input. In the method of using the buffer ring, it is possible to obtain, as the delay characteristic information of the circuit to be measured, the ratio of the delay time when the low-level signal is input and the delay time when the high-level signal is input.

By using the sum of the delay time when the low-level signal is input and the delay time when the high-level signal is input obtained by the method of using the ring oscillator, and the ratio of the delay time when the low-level signal is input and the delay time when the high-level signal is input obtained by the method of using the buffer ring, it is possible to obtain the value of each of the delay time when the low-level signal is input and the delay time when the high-level signal, is input. However, if the ring oscillator and the buffer ring each using the circuits to be measured are separately formed, in the semiconductor integrated circuit, as circuits for test for obtaining the pieces of delay characteristic information, the circuit area is increased.

Accordingly, in embodiments to be described hereinafter, it is designed such that one circuit can be switched to the ring oscillator and the buffer ring each using the circuits to be measured. This makes it possible to obtain the sum and the ratio of the delay time when the low-level signal is input and the delay time when the high-level signal is input, as the pieces of delay characteristic information of the circuit to be measured, and to obtain a value of each of the delay time when the low-level signal is input and the delay time when the high-level signal is input while suppressing an increase in the circuit area.

First Embodiment

A first embodiment will be described.

Figure 1:
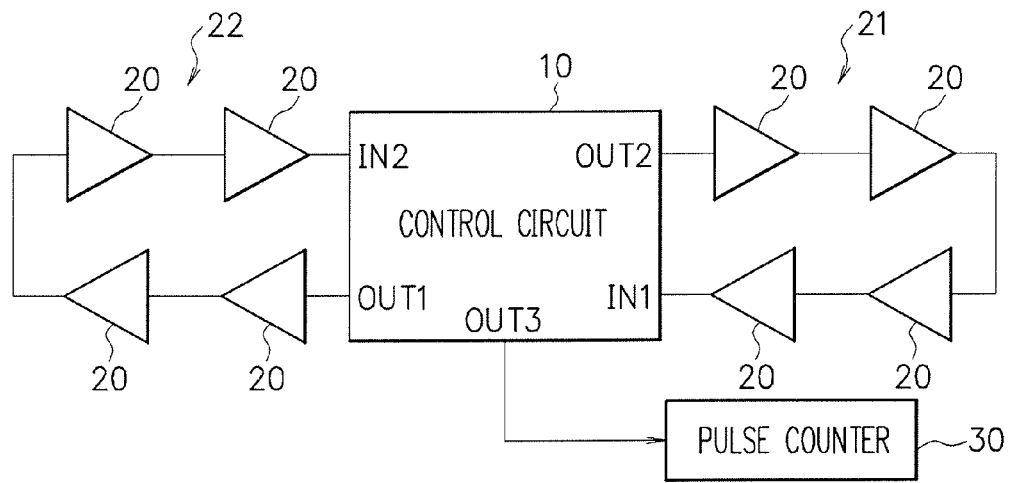
FIG. 1 is a diagram illustrating a configuration example of a semiconductor integrated circuit in a first embodiment.

FIG. 1 is a diagram illustrating a configuration example of a semiconductor integrated circuit in the first embodiment of the present embodiment. The semiconductor integrated circuit in the first embodiment includes a control circuit 10, a plurality of buffers 20, and a pulse counter 30. Each of the buffers 20 is a circuit to be measured, and outputs a signal whose logic is the same as that of a signal input therein.

An input of a first buffer circuit 21 in which the plurality of buffers 20 being the circuits to be measured are connected in series (an input terminal of the buffer 20 at a first stage in the first buffer circuit 21) and a second output terminal OUT2 of the control circuit 10 are connected. An output of the first buffer circuit 21 (an output terminal of the buffer 20 at a final stage in the first buffer circuit 21) and a first input terminal IN1 of the control circuit 10 are connected.

In like manner, an input of a second buffer circuit 22 in which the plurality of buffers 20 being the circuits to be measured are connected in series (an input terminal of the buffer 20 at a first stage in the second buffer circuit 22) and a first output terminal OUT1 of the control circuit 10 are connected. An output of the second buffer circuit 22 (an output terminal of the buffer 20 at a final stage in the second buffer circuit 22) and a second input terminal IN2 of the control circuit 10 are connected. A number of the buffers 20 included in the second buffer circuit 22 is the same as a number of the buffers 20 included in the first buffer circuit 21.

When a first operation is set, the control circuit 10 outputs a signal whose logic is the same as that of a signal input into the first input terminal IN1, from the first output terminal OUT1. Specifically, when the first operation is set, the control circuit 10 outputs a low-level signal from the first output terminal OUT1 if a low-level signal is input into the first input terminal IN1, and the control circuit 10 outputs a high-level signal from the first output terminal OUT1 if a high-level signal is input into the first input terminal IN1. Further, when the first operation is set, the control circuit 10 outputs a signal whose logic is different from that of a signal input into the second input terminal IN2 (logic inverted signal), from the second output terminal OUT2. Specifically, when the first operation is set, the control circuit 10 outputs a high-level signal from the second output terminal OUT2 if a low-level signal is input into the second input terminal IN2, and the control circuit 10 outputs a low-level signal from the second output terminal OUT2 if a high-level signal is input into the second input terminal IN2.

When a second operation is set, the control circuit 10 outputs a signal whose logic is the same as that of the signal input into the first input terminal IN1, from the first output terminal OUT1, and outputs a signal whose logic is the same as that of the signal input into the second input terminal IN2, from the second output terminal OUT2. In the manner as described above, when the first operation is set, the entire circuit is designed to be a negative logic, thereby realizing a circuit function as a ring oscillator with the use of the control circuit 10, the first buffer circuit 21, and the second buffer circuit 22. When the second operation is set, the entire circuit is designed to be a positive logic, thereby realizing a circuit function as a buffer ring with the use of the control circuit 10, the first buffer circuit 21, and the second buffer circuit 22.

The control circuit 10 outputs an output signal based on the signal input into the first input terminal IN1 (a signal as a result of inverting the logic of the signal input into the first input terminal IN1, for example), from a third output terminal OUT3. The pulse counter 30 is a counter circuit that receives the output signal output from the third output terminal OUT3 of the control circuit 10, and counts a number of pulses.

Figure 2:
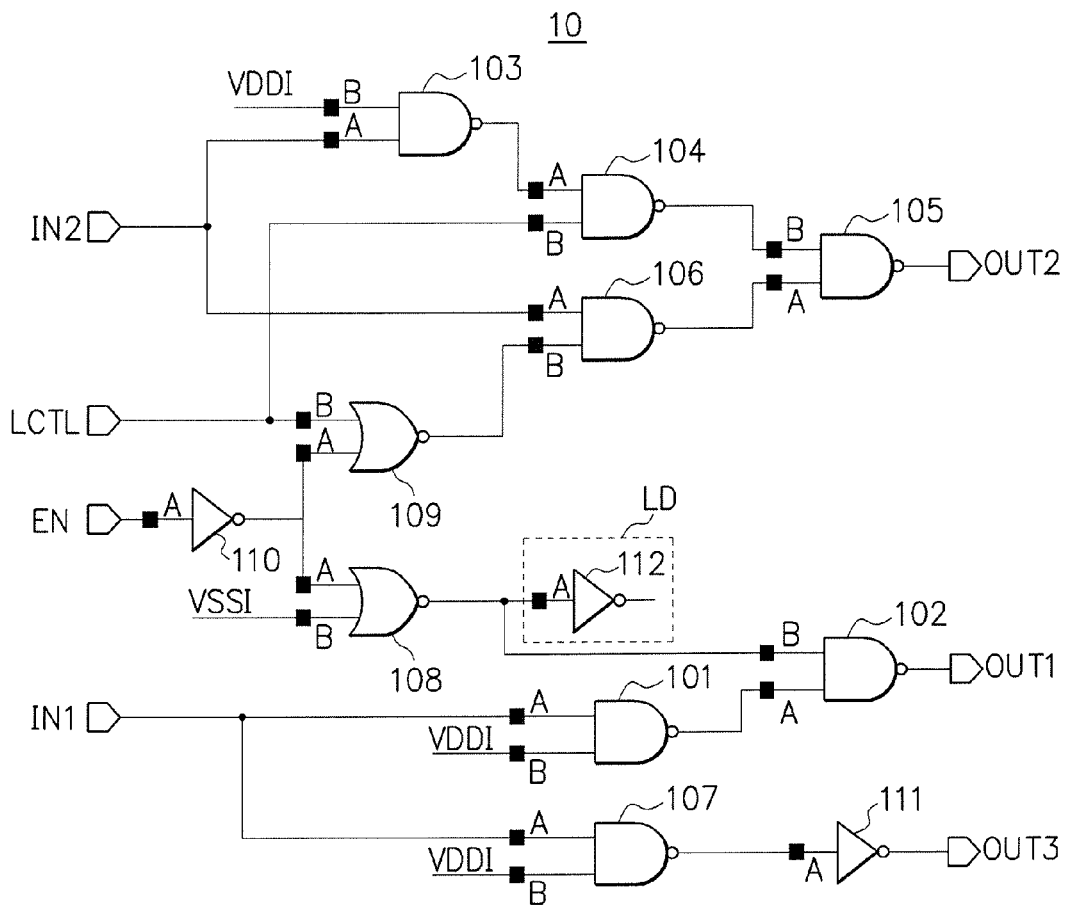
FIG. 2 is a diagram illustrating a configuration example of a control circuit in the present embodiment.

FIG. 2 is a diagram illustrating a configuration example of the control circuit 10 in the present embodiment. The control circuit 10 includes negative logical product operation circuits (NAND circuits) 101 to 107, negative logical sum operation circuits (NOR circuits) 108 and 109, inverters 110 and 111, and a load capacitor LD.

The NAND circuit 101 includes an input terminal A connected to the first input terminal IN1 of the control circuit 10, and an input terminal B connected to a high-potential-side internal power supply (voltage VDDI). The NAND circuit 102 includes an input terminal A connected to an output terminal of the NAND circuit 101, an input terminal B connected to an output terminal of the NOR circuit 108, and an output terminal connected to the first output terminal OUT1 of the control circuit 10.

The NAND circuit 103 includes an input terminal A connected to the second input terminal IN2 of the control circuit 10, and an input terminal B connected to the high-potential-side internal power supply (voltage VDDI). The NAND circuit 104 includes an input terminal A connected to an output terminal of the NAND circuit 103, and an input terminal B connected to a logic control terminal LCTL of the control circuit 10. The NAND circuit 105 includes an input terminal A connected to an output terminal of the NAND circuit 106, an input terminal B connected to an output terminal of the NAND circuit 104, and an output terminal connected to the second output terminal OUT2 of the control circuit 10. The NAND circuit 106 includes an input terminal A connected to the second input terminal IN2 of the control circuit 10, and an input terminal B connected to an output terminal of the NOR circuit 109.

The NAND circuit 107 includes an input terminal A connected to the first input terminal IN1 of the control circuit 10, and an input terminal B connected to the high-potential-side internal power supply (voltage VDDI). The inverter 111 includes an input terminal connected to an output terminal of the NAND circuit 107, and an output terminal connected to the third output terminal OUT3 of the control circuit 10. Therefore, from the third output terminal OUT3 of the control circuit 10, a signal whose logic is the same as that of the signal input into the first input terminal IN1 is output via the NAND circuit 107 and the inverter 111.

The NOR circuit 108 includes an input terminal A connected to an output terminal of the inverter 110, and an input terminal B connected to a low-potential-side internal power supply (voltage VSSI). The NOR circuit 109 includes an input terminal A connected to the output terminal of the inverter 110, and an input terminal B connected to the logic control terminal LCTL of the control circuit 10. The inverter 110 includes an input terminal connected to an oscillation control terminal EN of the control circuit 10.

The logic control terminal LCTL is a terminal into which a logic control signal LCTL for switching whether the first operation is set or the second operation is set, is input. In the present embodiment, when the logic control signal LCTL is at a high level, the first operation is set in the control circuit 10 so that the entire circuit including the control circuit 10, the first buffer circuit 21, and the second buffer circuit 22 is a negative logic. When the logic control signal LCTL is at a low level, the second operation is set in the control circuit 10 so that the entire circuit including the control circuit 10, the first buffer circuit 21, and the second buffer circuit 22 is a positive logic.

The oscillation control terminal EN is a terminal into which an oscillation control signal EN for controlling whether or not an oscillation operation with the use of the control circuit 10, the first buffer circuit 21, and the second buffer circuit 22 is conducted, is input. In the present embodiment, when the oscillation control signal EN is at a high level, the oscillation operation with the use of the control circuit 10, the first buffer circuit 21, and the second buffer circuit 22 is conducted, and when the oscillation control signal EN is at a low level, it is designed such that the oscillation operation is not conducted.

The control circuit 10 illustrated in FIG. 2 performs the oscillation operation under the setting of the first operation, when the logic control signal LCTL is at a high level and the oscillation control signal EN is at a high level. At this time, from the first output terminal OUT1, a signal whose logic is the same as that of the signal input into the first input terminal IN1 is output via the NAND circuits 101 and 102. From the second output terminal OUT2, a signal whose logic is different from that of the signal input into the second input terminal IN2 (logic inverted signal) is output via the NAND circuits 103, 104, and 105.

When the logic control signal LCTL is at a high level and the oscillation control signal EN is at a low level, the control circuit 10 does not conduct the oscillation operation, although the first operation is set. At this time, from the first output terminal OUT1, a fixed high-level signal is output by the inverter 110, the NOR circuit 108, and the NAND circuit 102. From the second output terminal OUT2, a signal whose logic is different from that of the signal input into the second input terminal IN2 (logic inverted signal) is output via the NAND circuits 103, 104, and 105.

When the logic control signal LCTL is at a low level and the oscillation control signal EN is at a high level, the control circuit 10 performs the oscillation operation under the setting of the second operation. At this time, from the first output terminal OUT1, a signal whose logic is the same as that of the signal input into the first input terminal IN1 is output via the NAND circuits 101 and 102. From the second output terminal OUT2, a signal whose logic is the same as that of the signal input into the second input terminal IN2 is output via the NAND circuits 106 and 105.

When the logic control signal LCTL is at a low level and the oscillation control signal EN is at a low level, the control circuit 10 does not conduct the oscillation operation, although the second operation is set. At this time, from the first output terminal OUT1, a fixed high-level signal is output by the inverter 110, the NOR circuit 108, and the NAND circuit 102. From the second output terminal OUT2, a fixed low-level signal is output by the inverter 110, the NOR circuit 109, and the NAND circuits 104, 106, and 105.

When the oscillation operation is conducted under the setting of the second operation (positive logic), the signal input into the first input terminal IN1 is output from the first output terminal OUT1 via the NAND circuits 101 and 102, and the signal input into the second input terminal IN2 is output from the second output terminal OUT2 via the NAND circuits 106 and 105. At this time, it is designed such that the signal is transmitted from the first input terminal IN1 to the first output terminal OUT1 by using the input terminals A of the NAND circuits 101 and 102, and the signal is transmitted from the second input terminal IN2 to the second output terminal OUT2 by using the input terminals A of the NAND circuits 106 and 105. Consequently, in the oscillation operation under the setting of the second operation (positive logic), a delay time from the first input terminal IN1 to the first output terminal OUT1 and a delay time from the second input terminal IN2 to the second output terminal OUT2 become equivalent.

Since the delay from the first input terminal IN1 to the first output terminal OUT1 is caused by two stages of gates, and the delay from the second input terminal IN2 to the second output terminal OUT2 is caused by two stages or three stages of gates, so that it is possible to reduce the delay time, when compared to a case where a switching is made by using a circuit such as a multiplexer.

The load capacitor LD illustrated in FIG. 2 is a delay adjustment circuit which matches a timing at which the signal output from the first output terminal OUT1 changes with a timing at which the signal output from the second output terminal OUT2 changes, at the time of the start of the oscillation operation under the setting of the second operation (positive logic). By adjusting the delay time by the load capacitor LD as the delay adjustment circuit, it is possible to perform the simultaneous oscillation when starting the oscillation operation under the setting of the second operation (positive logic). Although FIG. 2 illustrates an example of using an inverter 112 as the load capacitor LD, the circuit used as the load capacitor LD may be appropriately determined in accordance with the circuit configuration and the like.

Figure 3:
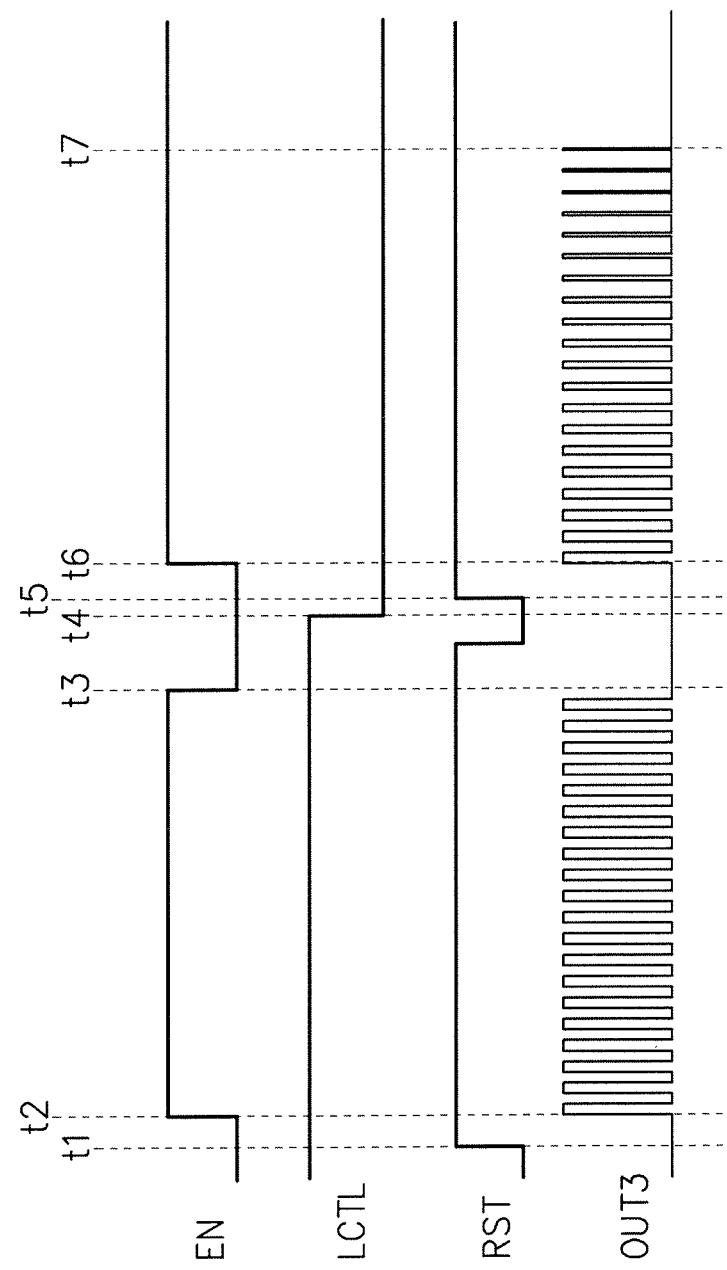
FIG. 3 is a diagram illustrating an example of operation of the semiconductor integrated circuit in the present embodiment.

FIG. 3 is a diagram illustrating an operation example of the semiconductor integrated circuit in the present embodiment. FIG. 3 illustrates an example of a case where the oscillation operation is conducted by making the entire circuit including the control circuit 10, the first buffer circuit 21, and the second buffer circuit 22 is a negative logic (ring oscillator), and then the oscillation operation is conducted by making the entire circuit is a positive logic (buffer ring).

By a reset signal RST, the control circuit 10, the first buffer circuit 21, the second buffer circuit 22, and the pulse counter 30 are set to be in an initial state, and at a time t1, the reset signal RST is negated. At this time, since the logic control signal LCTL is at a high level, the control circuit 10 outputs the signal whose logic is the same as that of the signal input into the first input terminal IN1, from the first output terminal OUT1, and outputs the signal whose logic is different from that of the signal input into the second input terminal IN2 (logic inverted signal), from the second output terminal OUT2. None that since the oscillation control signal EN is at a low level at the time t1, the output from the first output terminal OUT1 is fixed to a high level. Therefore, the input and output of the buffer of the second buffer circuit 22 are at a high level, and the input and output of the buffer of the first buffer circuit 21 are at a low level.

Next, at a time t2, when the oscillation control signal EN is set to a high level from a low level, the oscillation by the control circuit 10, the first buffer circuit 21, and the second buffer circuit 22 is started. At a time t3 after an elapse of certain period of time from the time t2, the oscillation control signal EN is set to a low level from a high level, resulting in that the oscillation by the control circuit 10, the first buffer circuit 21, and the second buffer circuit 22 is stopped. The number of pulses of an output signal OUT3 in the oscillation operation from the time t2 to the time t3 is counted by the pulse counter 30. The counted number of pulses is read out to the outside or held in the pulse counter 30 (when the number of pulses is held in the pulse counter 30, it is designed to be held in a region which is not initialized by the later-described reset signal RST).

Subsequently, the control circuit 10, the first buffer circuit 21, the second buffer circuit 22, and the pulse counter 30 are set to be in the initial state by the reset signal RST, the logic control signal LCTL is set to a low level at a time t4, and after that, the reset signal RST is negated at a time t5. At this time, since the logic control signal LCTL is at a low level, the control circuit 10 outputs the signal whose logic is the same as that of the signal input into the first input terminal IN1, from the first output terminal OUT1, and outputs the signal whose logic is the same as that of the signal input into the second input terminal IN2, from the second output terminal OUT2. Note that since the oscillation control signal EN is at a low level at the time t5, the output from the first output terminal OUT1 is fixed to a high level, and the output from the second output terminal OUT2 is fixed to a low level. Therefore, the input and output of the buffer of the second buffer circuit 22 are at a high level, and the input and output of the buffer of the first buffer circuit 21 are at a low level.

Next, at a time t6, when the oscillation control signal EN is set to a high level from a low level, a low-level signal is output from the first output terminal OUT1 of the control circuit 10, and at the same time, a high-level signal is output from the second output terminal OUT2 of the control circuit 10, and the oscillation by the control circuit 10, the first buffer circuit 21, and the second buffer circuit 22 is started. After that, due to a difference between a delay time in the vicinity of a high level and a delay time in the vicinity of a low level in the control circuit 10, the first buffer circuit 21, and the second buffer circuit 22, the oscillation is stopped at a time t7, for example. The number of pulses of the output signal OUT3 in the oscillation operation from the time t6 and thereafter is counted by the pulse counter 30. The counted number of pulses is then read out to the outside. Note that when the number of pulses in the oscillation operation from the time t2 to the time t3 is held in the pulse counter 30, the number of pulses is also read out. A method of reading out the number of pulses from the pulse counter 30 is arbitrary, and it is also possible to read out the number of pulses through a scan shift operation and the like using a clock for scan shift, for example.

In the manner as described above, according to the present embodiment, by making the entire circuit is a negative logic to realize the circuit function as the ring oscillator with the use of the control circuit 10, the first buffer circuit 21, and the second buffer circuit 22, it is possible to measure the number of times of oscillation during the certain period. Consequently, it is possible to obtain, as the delay characteristic information of the buffer 20 being the circuit to be measured, the sum of the delay time when the low-level signal is input and the delay time when the high-level signal is input.

Further, according to the present embodiment, by making the entire circuit is a positive logic to realize the circuit function as the buffer ring with the use of the control circuit 10, the first buffer circuit 21, and the second buffer circuit 22, it is possible to measure the number of times of oscillation up to when the oscillation is stopped due to the difference of the delay times and a signal level when the oscillation is stopped. Consequently, it is possible to obtain, as the delay characteristic information of the buffer 20 being the circuit to be measured, the ratio of the delay time when the low-level signal is input and the delay time when the high-level signal is input.

Specifically, according to the present embodiment, by controlling the control circuit 10, the circuit function as the ring oscillator and the circuit function as the buffer ring with the use of the control circuit 10, the first buffer circuit 21, and the second buffer circuit 22 can be realized by being switched. Therefore, even if the ring oscillator and the buffer ring are not separately provided, it is possible to obtain, in the same circuit, the sum and the ratio of the delay time when the low-level signal is input and the delay time when the high-level signal is input, as the pieces of delay characteristic information of the buffer 20 being the circuit to be measured, and to obtain the value of each of the delay time when the low-level signal is input and the delay time when the high-level signal is input.

Figure 4A:
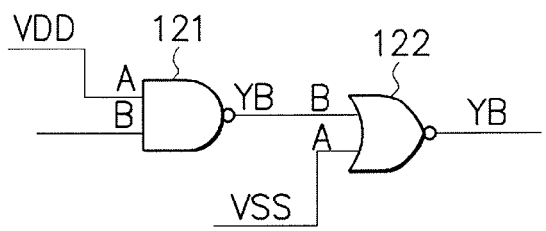
FIG. 4A is a diagram illustrating a configuration example of a circuit to be measured in the present embodiment.

FIG. 4A is a diagram illustrating an example of the buffer 20 being the circuit to be measured in the present embodiment. FIG. 4A illustrates an example in which a NAND circuit 121 and a NOR circuit 122 are used as the buffer 20. In the example illustrated in FIG. 4A, a high-potential-side power supply (voltage VDD) is input into an input terminal A of the NAND circuit 121, and an input signal with respect to the buffer 20 is input into an input terminal B of the NAND circuit 121. A low-potential-side power supply (voltage VSS) is input into an input terminal A of the NOR circuit 122, and an output of the NAND circuit 121 is input into an input terminal B of the NOR circuit 122, and an output of the NOR circuit 122 is output as an output signal from the buffer 20.

Figure 4B:
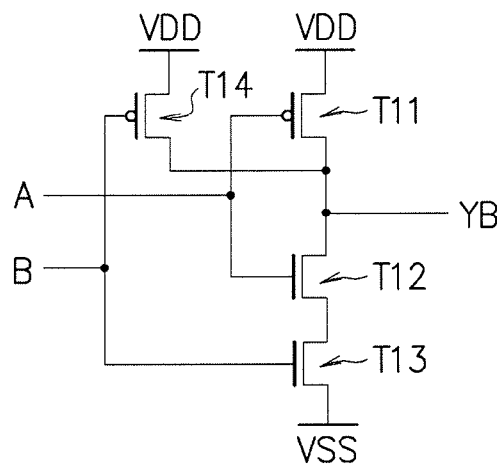
FIG. 4B is a diagram illustrating a configuration example of a NAND circuit illustrated in FIG. 4A.

The NAND circuit 121 includes P-channel type transistors T11 and T14, and N-channel type transistors T12 and T13, as illustrated in FIG. 4B. Each of the P-channel type transistors T11 and T14 includes a source connected to the high-potential-side power supply (voltage VDD), and a drain connected to an output terminal YB of the NAND circuit 121. The P-channel type transistor T11 includes a gate connected to the input terminal A of the NAND circuit 121, and the P-channel type transistor T14 includes a gate connected to the input terminal B of the NAND circuit 121. The N-channel type transistor T12 includes a drain connected to the output terminal YB of the NAND circuit 121, a source connected to a drain of the N-channel type transistor T13, and a gate connected to the input terminal A of the NAND circuit 121. The N-channel type transistor T13 includes a source connected to the low-potential-side power supply (voltage VSS), and a gate connected to the input terminal B of the NAND circuit 121.

Figure 4C:
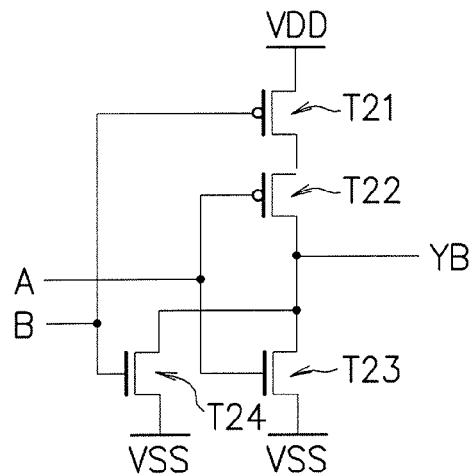
FIG. 4C is a diagram illustrating a configuration example of a NCR circuit illustrated in FIG. 4A.

The NOR circuit 122 includes P-channel type transistors T21 and T22, and N-channel type transistors T23 and T24, as illustrated in FIG. 4C. The P-channel type transistor T21 includes a source connected to the high-potential-side power supply (voltage VDD), a drain connected to a source of the P-channel type transistor T22, and a gate connected to the input terminal B of the NOR circuit 122. The P-channel type transistor 122 includes a drain connected to an output terminal YB of the NOR circuit 122, and a gate connected to the input terminal A of the NOR circuit 122. Each of the N-channel type transistors T23 and T24 includes a source connected to the low-potential-side power supply (voltage VSS), and a drain connected to the output terminal YB of the NOR circuit 122. The N-channel type transistor T23 includes a gate connected to the input terminal A of the NOR circuit 122, and the N-channel type transistor T24 includes a gate connected to the input terminal B of the NOR circuit 122.

Therefore, as illustrated in FIG. 4A, if the high-potential-side power supply (voltage VDD) is input into the input terminal A of the NAND circuit 121, and the low-potential-side power supply (voltage VSS) is input into the input terminal A of the NOR circuit 122, when the signal input into the buffer changes from a high level to a low level, it is possible to measure a delay time of the P-channel type transistor (T14) of one stage and the N-channel type transistor (T24) of one stage. Further, when the signal input into the buffer changes from a low level to a high level, it is possible to measure a delay time of the N-channel type transistors (T12 and T13) of two stages which are loaded longitudinally and the P-channel type transistors (T21 and T22) of two stages which are loaded longitudinally. In the manner as described above, it is possible to measure the delay of the transistor itself and the delay of the transistors which are loaded longitudinally.

Figure 5A:
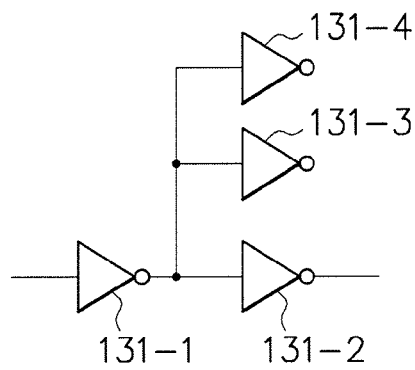
FIG. 5A is a diagram illustrating a configuration example of a circuit to be measured in the present embodiment.
Figure 5B:
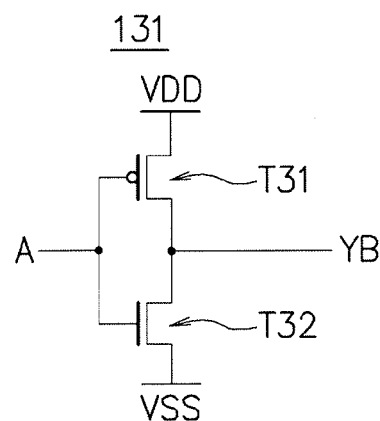
FIG. 5B is a diagram illustrating a configuration example of an inverter illustrated in FIG. 5A.

Further, as illustrated in FIG. 5A, by adding capacity loads (inverters 131-3 and 131-4, in the example) to the inside of the buffer 20 formed by connecting inverters 131-1 and 131-2 in series, a delay time of the inverter 131-1 at a first stage is increased, resulting in that a delay characteristic of each of an N-channel type transistor and a P-channel type transistor can be obtained. Each of the inverters 131 illustrated in FIG. 5A includes a P-channel type transistor T31 and an N-channel type transistor T32, as illustrated in FIG. 5B. The P-channel type transistor T31 includes a source connected to the high-potential-side power supply (voltage VDD), drain connected to a drain of the N-channel type transistor T32, and a gate connected to an input terminal of the inverter 131. The N-channel type transistor T32 includes a source connected to the low-potential-side power supply (voltage VSS), and a gate connected to the input terminal of the inverter 131. An interconnection point between the drain of the P-channel type transistor T31 and the drain of the N-channel type transistor T32 is connected to an output terminal of the inverter 131.

Note that the configuration of the buffer 20 being the circuit to be measured illustrated in FIG. 4A and FIG. 5A is one example, and is not limited to this. The circuit configuration of the buffer 20 being the circuit to be measured in the present embodiment may be appropriately selected in accordance with the delay characteristic information to be obtained and the like.

Second Embodiment

Next, a second embodiment will be described.

As described above, the ratio of the delay time when the low-level signal is input and the delay time when the high-level signal is input can be obtained by N:(N+½) with the use of the number of pulses N up to when the oscillation is stopped. Accordingly, in a path of circuits to be measured using buffers, when a delay time when a low-level signal is input and a delay time when a high-level signal is input are approximately equal, a value of the number of pulses N becomes large, resulting in that a sufficient accuracy can be achieved. On the other hand, in the path of the circuits to be measured using the buffers, when a difference between the delay time when the low-level signal is input and the delay time when the high-level signal is input is large (when there is a difference of about two times, for example), the oscillation is stopped after the signal travels several rounds, resulting in that the number of pulses N is small, and an error becomes large.

Accordingly, in the second embodiment to be described below, when the difference between the delay time when the low-level signal is input and the delay time when the high-level signal is input in the path of the circuits to be measured is large, a large number of delay circuits in each of which the delay time when the low-level signal is input and the delay time when the high-level signal is input are the same are inserted into the path of the circuits to be measured. Consequently, the number of pulses up to when the oscillation is stopped is increased, to thereby improve the accuracy of the delay characteristic information to be obtained.

Figure 6:
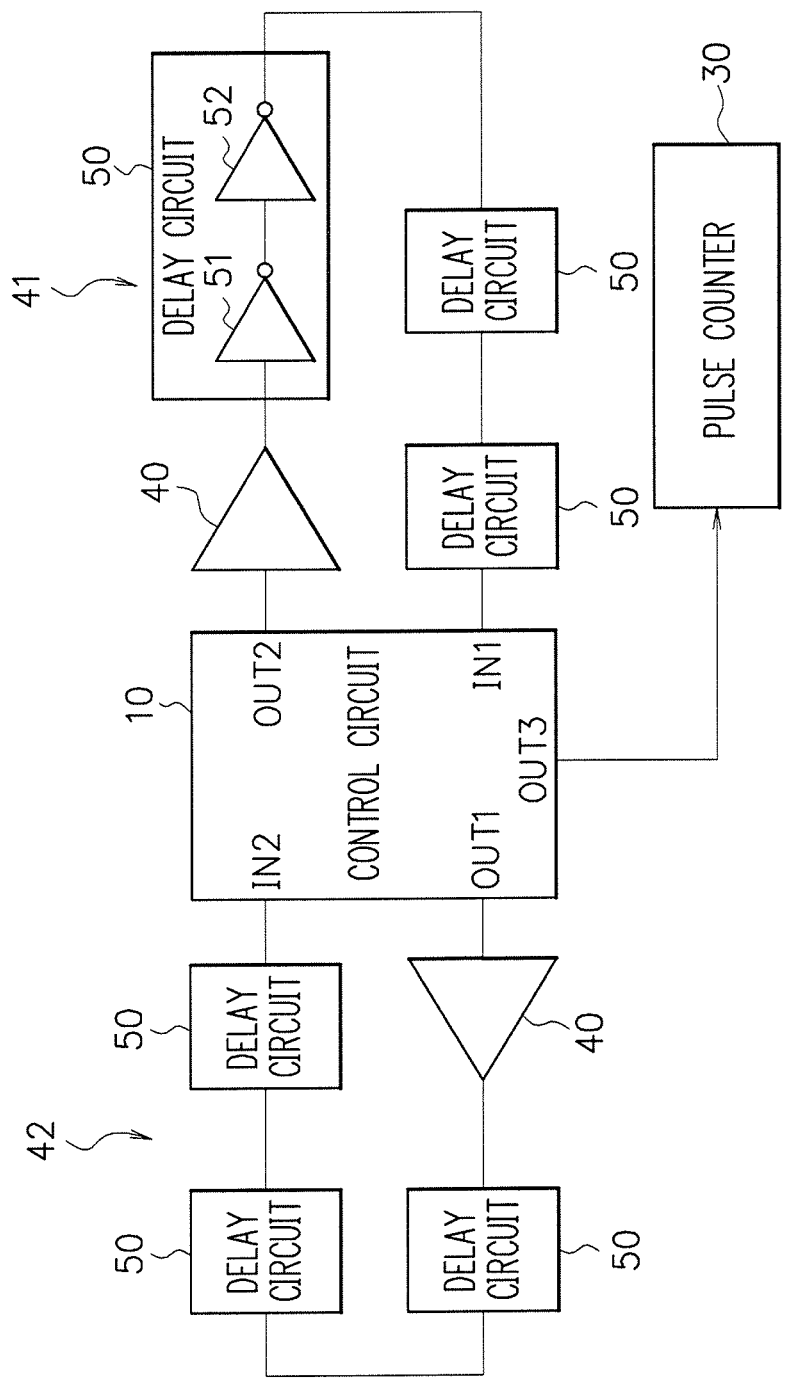
FIG. 6 is a diagram illustrating a configuration example of a semiconductor integrated circuit in a second embodiment.

FIG. 6 is a diagram illustrating a configuration example of a semiconductor integrated circuit in the second embodiment. In FIG. 6, components and the like having the same function as that of the components and the like illustrated in FIG. 1 are denoted by the same reference numerals, and overlapped explanation thereof will be omitted. The semiconductor integrated circuit in the second embodiment includes the control circuit 10, the pulse counter 30, a plurality of buffers 40, and a plurality of delay circuits 50. Note that in FIG. 6, although the configuration corresponding to the first buffer circuit and the configuration of the second buffer circuit illustrated in FIG. 1 are simplified, and are respectively illustrated as one buffer 40, in the configuration, a plurality of buffers are connected in series, similar to FIG. 1.

Each of a first buffer circuit 41 and a second buffer circuit 42 includes the buffer 40 and the plurality of delay circuits 50 connected in series. The buffer 40 of the first buffer circuit 41 includes a plurality of buffers being the circuits to be measured connected in series, which correspond to the first buffer circuit 21 illustrated in FIG. 1. The buffer 40 of the second buffer circuit 42 includes a plurality of buffers being the circuits to be measured connected in series, which correspond to the second buffer circuit 22 illustrated in FIG. 1.

The delay circuit 50 is a circuit in which the delay time when the low-level signal is input and the delay time when the high-level signal is input are the same. As illustrated in FIG. 6, for example, the delay circuit 50 includes two inverters 51 and 52 which are connected so as to have the same wiring load due to an output wiring and the like. The plurality of delay circuits 50 are inserted into the first buffer circuit 41 and the second buffer circuit 42 in a similar manner.

Regarding the obtainment of the pieces of delay characteristic information of the buffer being the circuit to be measured, the sum and the ratio of the delay time when the low-level signal is input and the delay time when the high-level signal is input are obtained by using a circuit configuration including the delay circuits 50, in a similar manner to that of the first embodiment. Specifically, by using the control circuit 10, the first buffer circuit 41, and the second buffer circuit 42, the circuit function as the ring oscillator and the circuit function as the buffer ring are switched, and the sum and the ratio of the delay time when the low-level signal is input and the delay time when the high-level signal is input are obtained.

Further, with the use of the circuit configuration in which the buffer 40 is removed from each of the first buffer circuit 41 and the second buffer circuit 42, the sum and the ratio of the delay time when the low-level signal is input and the delay time when the high-level signal is input are obtained. Specifically, with the use of the circuit configuration in which each of the first buffer circuit 41 and the second buffer circuit 42 is formed only of the inserted delay circuits 50, the circuit function as the ring oscillator and the circuit function as the buffer ring are switched, and the sum and the ratio of the delay time when the low-level signal is input and the delay time when the high-level signal is input are obtained by using the control circuit 10, the first buffer circuit 41, and the second buffer circuit 42.

In the manner as described above, it is possible to obtain the value of each of the delay time when the low-level signal is input and the delay time when the high-level signal is input in the buffer 40, from the pieces of delay characteristic information obtained by the first buffer circuit 41 and the second buffer circuit 42 each including the buffer 40, and the pieces of delay characteristic information obtained by the first buffer circuit 41 and the second buffer circuit 42 each including no buffer 40.

By inserting the plurality of delay circuits 50 as illustrated in FIG. 6, a total sum of the delay time when the low-level signal is input and the delay time when the high-level signal is input becomes large. Accordingly, a proportion of a difference of the delay times with respect to the total sum of the delay time when the low-level signal is input and the delay time when the high-level signal is input becomes small, and it is possible to increase the number of pulses up to when the oscillation is stopped due to the difference of the delay times, resulting in that the accuracy of the delay characteristic information to be obtained can be improved.

Note that in the example illustrated in FIG. 6, it is designed such that the plurality of delay circuits 50 connected in series are inserted into a rear stage of the buffer 40 corresponding to the plurality of buffers connected in series, but, the position at which the delay circuits 50 are inserted into each of the first buffer circuit 41 and the second buffer circuit 42 is arbitrary. It is only needed that the same number of the delay circuits 50 are inserted into each of the first buffer circuit 41 and the second buffer circuit 42, and it is desirable that the first buffer circuit 41 and the second buffer circuit 42 are the same circuit configuration including the wiring and the like.

Figure 7A:
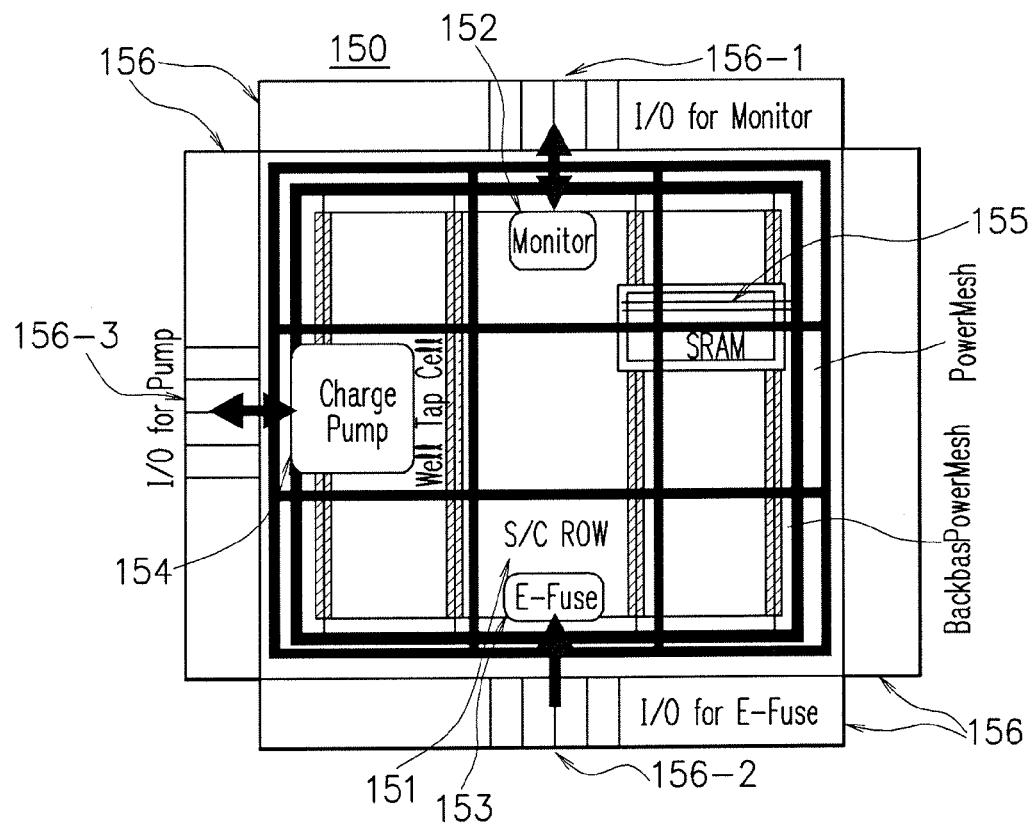
FIG. 7A and FIG. 7B are diagrams illustrating an example where the semiconductor integrated circuit in the present embodiment is applied to an ABB system.
Figure 7B:
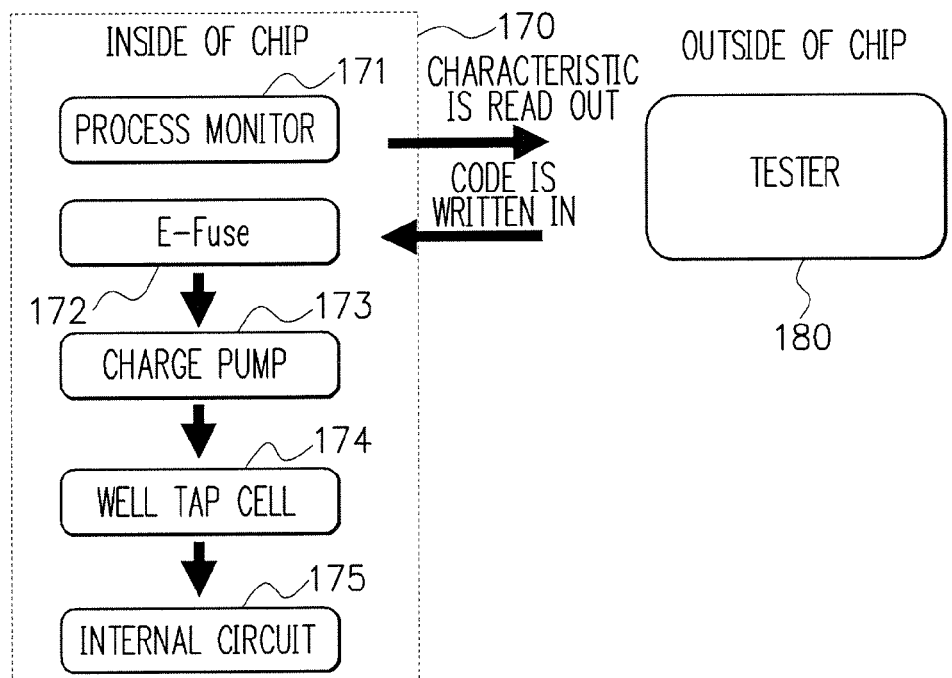
Figure 8A:
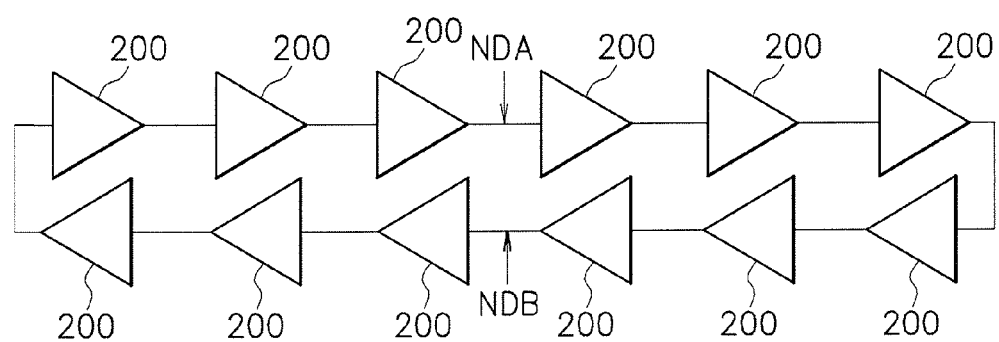
FIG. 8A and FIG. 8B are diagrams for explaining a method of obtaining delay characteristic information by using a buffer ring.
Figure 8B:
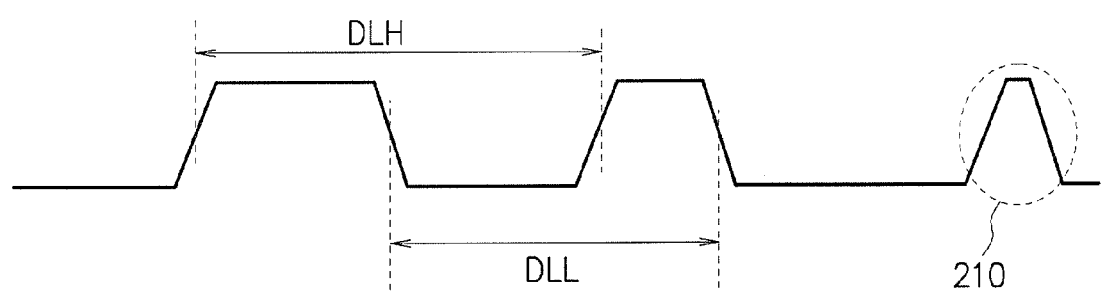

FIG. 7A and FIG. 7B are diagrams illustrating an example in which the semiconductor integrated circuit in the first and second embodiments described above is applied to an ABB system which conducts a voltage control of back bias in accordance with a process variation. An example of layout is illustrated in FIG. 7A, in which in a chip 150, a standard cell (unit cell) is disposed on a region 151, and a monitor circuit (process monitor) 152 as illustrated in FIG. 1 and FIG. 6 is disposed. To the chip 150, a fuse circuit 153 which can be electrically disconnected and connected and holds control information, a charge pump circuit 154 which generates a power supply supplied to the circuits inside of the chip 150 based on an input electric power, and a memory circuit 155 are appropriately provided.

The chip 150 includes input/output circuits (I/O circuits) 156 which perform input/output of data and the like with an outside of the chip 150. In the example illustrated in FIG. 7A, for example, an I/O circuit 156-1 for the monitor circuit 152, an I/O circuit 156-2 for the fuse circuit 153, and an I/O circuit 156-3 for the charge pump circuit 154 are illustrated.

FIG. 7B is a diagram illustrating an example of control of the ABB system illustrated in FIG. 7A. By a monitor circuit (process monitor) 171 inside of a chip 170, the circuit function is switched to the ring oscillator and the buffer ring, and the sum and the ratio of the delay time when the low-level signal is input and the delay time when the high-level signal is input are obtained as the pieces of delay characteristic information of the circuit to be measured. A tester 180 reads out the pieces of delay characteristic information obtained by the monitor circuit 171 in the chip 170, and determines, based on the read out pieces of delay characteristic information, a voltage code indicating a voltage supplied as a back bias to a cell in the chip in accordance with a process variation. The tester 180 writes the voltage code determined in accordance with the process variation, into the fuse circuit 172.

Subsequently, the charge pump circuit 173 generates a back bias voltage in accordance with the voltage code written into the fuse circuit 172. The voltage generated by the charge pump circuit 173 is supplied to a standard cell of an internal circuit 175 as the back bias voltage in accordance with the voltage code through a well region, via a back bias power supply mesh and a well tap cell 174. In the manner as described above, it is possible to supply the back bias voltage in accordance with the process variation, and to perform the appropriate voltage control in accordance with the process variation of the chip, resulting in that the low power consumption of the semiconductor integrated circuit can be improved.

Note that the semiconductor integrated circuit in the first and second embodiments described above can be applied not only to the ABB system illustrated in FIG. 7A and FIG. 7B but also to another technique of low power consumption such as an ASV and a DVFS.

The disclosed semiconductor integrated circuit can realize the circuit function as the ring oscillator and the circuit function as the buffer ring by switching the circuit functions, and it is possible to obtain, with the use of one circuit, the sum and the ratio of the delay time when the low-level signal is input and the delay time when the high-level signal is input in the circuit to be measured. Accordingly, it becomes possible to obtain the value of each of the delay time when the low-level signal is input and the delay time when the high-level signal is input in the circuit to be measured, while suppressing the increase in the circuit area.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor integrated circuit, comprising:
   a first buffer circuit which includes a plurality of buffers connected in series;
   a second buffer circuit which includes a plurality of buffers connected in series, a number of the plurality of buffers included in the second buffer circuit being the same as a number of the plurality of buffers included in the first buffer circuit; and
   a control circuit which includes a second output terminal connected to an input of the first buffer circuit, a first input terminal connected to an output of the first buffer circuit, a first output terminal connected to an input of the second buffer circuit, and a second input terminal connected to an output of the second buffer circuit, wherein
   when a first operation is set, the control circuit outputs a signal whose logic is the same as that of a signal input into the first input terminal, from the first output terminal, and outputs a signal whose logic is different from that of a signal input into the second input terminal, from the second output terminal, and
   when a second operation is set, the control circuit simultaneously outputs signals with different logics from the first output terminal and the second output terminal at a time of a start of an oscillation operation, outputs a signal whose logic is the same as that of the signal input into the first input terminal, from the first output terminal, and outputs a signal whose logic is the same as that of the signal input into the second input terminal, from the second output terminal.

2. The semiconductor integrated circuit according to claim 1, further comprising
   a counter circuit configured to count a number of pulses of a signal output from the control circuit.

3. The semiconductor integrated circuit according to claim 2, further comprising
   a charge pump circuit configured to supply a voltage determined based on first information and second information to an internal circuit of the semiconductor integrated circuit, the first information being a number of times of first oscillation, by the first buffer circuit, the second buffer circuit, and the control circuit, during a certain period measured in the first operation, and the second information being a number of times of second oscillation, by the first buffer circuit, the second buffer circuit, and the control circuit, up to when the second oscillation is stopped and a signal level when the second oscillation is stopped measured in the second operation.

4. The semiconductor integrated circuit according to claim 3, wherein
   each of the first buffer circuit and the second buffer circuit includes a plurality of delay circuits in each of which a delay time when a low-level signal is input and a delay time when a high-level signal is input are the same.

5. The semiconductor integrated circuit according to claim 2, wherein
   each of the first buffer circuit and the second buffer circuit includes a plurality of delay circuits in each of which a delay time when a low-level signal is input and a delay time when a high-level signal is input are the same.

6. The semiconductor integrated circuit according to claim 1, further comprising
   a charge pump circuit configured to supply a voltage determined based on first information and second information to an internal circuit of the semiconductor integrated circuit, the first information being a number of times of first oscillation, by the first buffer circuit, the second buffer circuit, and the control circuit, during a certain period measured in the first operation, and the second information being a number of times of second oscillation, by the first buffer circuit, the second buffer circuit, and the control circuit, up to when the second oscillation is stopped and a signal level when the second oscillation is stopped measured in the second operation.

7. The semiconductor integrated circuit according to claim 1, wherein
   each of the first buffer circuit and the second buffer circuit includes a plurality of delay circuits in each of which a delay time when a low-level signal is input and a delay time when a high-level signal is input are the same.

* * * * *